United States Patent
Li (10) Patent No.: US 7,396,730 B2
(45) Date of Patent: Jul. 8, 2008

(54) INTEGRATED CIRCUIT DEVICES INCLUDING AN L-SHAPED DEPLETION BARRIER LAYER ADJACENT OPPOSITE SIDES OF A GATE PATTERN AND METHODS OF FORMING THE SAME

(75) Inventor: Ming Li, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 11/000,260

(22) Filed: Nov. 30, 2004

(65) Prior Publication Data

US 2005/0173735 A1    Aug. 11, 2005

(30) Foreign Application Priority Data

Feb. 11, 2004    (KR) .................. 10-2004-0008972

(51) Int. Cl.
*H01L 21/336* (2006.01)

(52) U.S. Cl. ............................ 438/305; 257/E21.444; 438/183

(58) Field of Classification Search ................ 438/183, 438/199, 305; 257/E21.444, E21.453
See application file for complete search history.

(56) References Cited

U.S. PATENT DOCUMENTS

| | | | | |
|---|---|---|---|---|
| 5,759,901 A * | 6/1998 | Loh et al. | .................... | 438/305 |
| 5,994,731 A * | 11/1999 | Sato | ............................ | 257/306 |
| 6,051,509 A * | 4/2000 | Tsuchiaki | .................... | 438/758 |
| 6,124,614 A * | 9/2000 | Ryum et al. | ................. | 257/347 |
| 6,346,729 B1 * | 2/2002 | Liang et al. | .................. | 257/344 |
| 6,475,847 B1 * | 11/2002 | Ngo et al. | .................... | 438/201 |
| 6,583,000 B1 | 6/2003 | Hsu et al. | .................... | 438/222 |
| 6,864,547 B2 * | 3/2005 | Michejda et al. | ............ | 257/386 |
| 7,067,881 B2 * | 6/2006 | Matsumoto et al. | ......... | 257/347 |
| 2004/0188774 A1 * | 9/2004 | Takeda et al. | ............... | 257/394 |
| 2006/0051922 A1 * | 3/2006 | Huang et al. | ................ | 438/282 |

FOREIGN PATENT DOCUMENTS

| JP | 11-186544 | 7/1999 |
|---|---|---|
| KR | 010004089 | 1/2001 |

* cited by examiner

*Primary Examiner*—Thao P. Le
(74) *Attorney, Agent, or Firm*—Myers Bigel Sibley & Sajovec (57) ABSTRACT

Integrated circuit devices include an integrated circuit substrate having a channel region therein. A gate pattern is disposed on a top surface of the channel region. A depletion barrier layer covers a surface of the integrated circuit substrate adjacent opposite sides of the gate pattern and extending along a portion of a lateral face of the channel region. A source/drain layer is disposed on the depletion barrier layer and electrically contacting the lateral face of the channel region in a region not covered by the depletion barrier layer. The channel region may protrude from a surface of the substrate. The depletion barrier layer may be an L-shaped depletion barrier layer and the device may further include a device isolation layer disposed at a predetermined portion of the substrate through the source/drain layer and the depletion barrier layer. The depletion barrier layer and the device isolation layer may be formed of the same material.

12 Claims, 8 Drawing Sheets

INTEGRATED CIRCUIT DEVICES INCLUDING AN L-SHAPED DEPLETION BARRIER LAYER ADJACENT OPPOSITE SIDES OF A GATE PATTERN AND METHODS OF FORMING THE SAME

CROSS-REFERENCE TO RELATED APPLICATION

This application is related to and claims priority from Korean Patent Application No. 2004-08972, filed on Feb. 11, 2004, the disclosure of which is hereby incorporated herein by reference in its entirety.

BACKGROUND OF THE INVENTION

The present invention relates to integrated circuit devices and, more particularly, to source/drain regions of integrated circuit devices and methods of forming the same.

As the density of semiconductor devices increases, a number of attempts have been made to overcome punch-through, drain induced barrier lowering (DIBL) and leakage current, which may be induced by a short channel effect. It is known to use a silicon on insulator (SOI) substrate, which may lead to an increased fabrication cost and cause a floating body effect. Conventionally, a buried oxide layer is typically partially inserted below source/drain regions of a device in order to reduce or prevent depletion. However, the partially inserted buried oxide layer generally does not prevent depletion from occurring in a horizontal direction at a sidewall of the source/drain region.

SUMMARY OF THE INVENTION

Embodiments of the present invention provide integrated circuit devices including an integrated circuit substrate having a channel region therein. A gate pattern is disposed on a top surface of the channel region. A depletion barrier layer covers a surface of the integrated circuit substrate adjacent opposite sides of the gate pattern and extending along a portion of a lateral face of the channel region. A source/drain layer is disposed on the depletion barrier layer and electrically contacts the lateral face of the channel region in a region not covered by the depletion barrier layer. The channel region may protrude from a surface of the substrate. The depletion barrier layer may be an L-shaped depletion barrier layer and the device may further include a device isolation layer disposed at a predetermined portion of the substrate through the source/drain layer and the depletion barrier layer. The depletion barrier layer and the device isolation layer may be formed of the same material.

In other embodiments of the present invention, the source/drain layer is epitaxial silicon doped with impurities. A thermal oxide layer may cover a top surface and a sidewall of the gate pattern and a top surface of the source/drain layer. A sidewall spacer may cover a sidewall face of the gate pattern. An insulating spacer may be interposed between the gate pattern and the sidewall spacer. The gate pattern may include a gate insulation layer contacting the channel region and a gate electrode disposed on the gate insulation layer.

In further embodiments of the present invention, methods of forming an integrated circuit device include forming a channel region on an integrated circuit substrate, forming a depletion barrier layer on the integrated circuit substrate and extending along a portion of a lateral face of the channel region and forming a source/drain layer disposed on the depletion barrier layer and electrically contacting the lateral face of the channel region in a region not covered by the depletion barrier layer. Forming a channel region may include forming a protruding channel region protruding from the integrated circuit substrate and forming the depletion barrier layer may include forming an L-shaped depletion barrier layer.

In yet other embodiments of the present invention, methods of forming a semiconductor device include forming a dummy gate pattern on a semiconductor substrate. A portion of the substrate adjacent opposite sides of the dummy gate pattern is removed to form a protruding channel region in the semiconductor substrate below the dummy gate pattern. An L-shaped sacrificial layer pattern is formed covering a surface of the substrate proximate opposite sides of the dummy gate pattern and extending along a portion of a sidewall of the protruding channel region. An epitaxial layer is formed covering a portion of the sidewall of the channel region not covered by the sacrificial layer pattern, covering a lower sidewall of the dummy gate pattern and covering the sacrificial layer pattern. The epitaxial layer, the sacrificial layer pattern, and a predetermined portion of the substrate are etched to form a trench exposing a sidewall of the epitaxial layer and a sidewall of the sacrificial layer pattern. The sacrificial layer pattern exposed by the trench is removed to define a path and a depletion barrier layer is formed in the defined path.

In further embodiments of the present invention, the methods further include removing the dummy gate pattern and forming a gate pattern on the channel region where the dummy gate pattern is removed. Forming a dummy gate pattern may include forming a pad oxide layer on the substrate, forming a hard mask layer on the pad oxide layer and sequentially patterning the hard mask layer and the pad oxide layer to form a sequentially stacked dummy gate pattern including a pad oxide pattern and a hard mask pattern. Removing the dummy gate pattern may include removing the hard mask pattern and removing the pad oxide pattern. Removing the pad oxide pattern may be preceded by implanting impurities into the substrate below the pad oxide pattern.

In other embodiments of the present invention, forming an L-shaped sacrificial pattern includes conformally stacking a sacrificial layer on a surface of the semiconductor substrate including the dummy gate pattern. A sacrificial oxide layer is formed on the sacrificial layer. The semiconductor device is planarized to expose the sacrificial layer on the dummy gate pattern. The exposed sacrificial layer is partially removed to partially expose a sidewall of the channel region below the dummy gate pattern and the sacrificial oxide layer is removed.

In some further embodiments of the present invention, forming the epitaxial layer includes forming the epitaxial layer using epitaxial growth of silicon. The sacrificial layer pattern may be silicon germanium (SiGe). Removing the sacrificial layer pattern may include removing the sacrificial layer pattern using as a plasma gas at least one of hydrogen ($H_2$), nitrogen ($N_2$), oxygen ($O_2$) or a fluoric compound. Forming a depletion barrier layer may include forming the depletion barrier layer by a wet etch using at least one of ammonium hydroxide ($NH_4OH$), hydrogen peroxide ($H_2O_2$), deionized water (DI water) or nitric acid.

In other embodiments of the present invention, forming a depletion barrier layer includes thermally oxidizing the substrate where the sacrificial layer is removed and forming an insulation layer. The insulation layer may be at least one of hydrogen silsesquioxane (HSQ), boron phosphorus silicate glass (BPSG), high density plasma (HDP) oxide, plasma enhanced tetraethyl orthosilicate (PETEOS), undoped silicate glass (USG), phosphorus silicate glass (PSG), plasma enhanced siliconhydride (PE-$SiH_4$), aluminum oxide ($Al_2O_3$), silicon nitride ($Si_3N_4$) or silicon oxynitride (SiON). The insulation layer may fill the trench and cover a sidewall of the dummy gate pattern and the epitaxial layer.

In further embodiments of the present invention, forming a gate pattern includes performing a thermal oxidation process to form a gate insulation layer on a surface of the substrate and a sidewall of the epitaxial layer. A polysilicon layer is stacked to fill the region where the dummy gate pattern is removed. A planarizing process is performed to expose the insulation layer and to form a gate electrode made of the polysilicon. Stacking a polysilicon layer may be followed by implanting impurities into the polysilicon layer. Forming the depletion barrier layer may include forming an insulation layer and forming the gate pattern may be followed by recessing the insulation layer to expose the epitaxial layer and to form a device isolation layer filling the trench. Forming the device isolation layer may be followed by implanting impurities into the epitaxial layer. Forming the device isolation layer may be followed by performing a gate re-oxidation process.

In yet other embodiments of the present invention, a spacer is formed covering the sidewall of the gate pattern. Forming the spacer may be followed by implanting impurities into the epitaxial layer. Implanting impurities may be followed by performing a rapid thermal annealing process.

In further embodiments of the present invention, methods of forming a semiconductor device include forming a dummy gate pattern including a pad oxide pattern and a hard mask pattern sequentially stacked on a semiconductor substrate. Using the dummy gate pattern, a predetermined portion of a region of the semiconductor substrate is etched to form a channel region protruding from a surface of the semiconductor substrate below the dummy gate pattern. A sacrificial layer is conformally stacked on a surface of the semiconductor substrate in the region where the protruding channel region is formed. A sacrificial oxide layer is formed on the sacrificial layer. The sacrificial oxide layer and the sacrificial layer are planarized and the sacrificial layer is exposed in a region covering a sidewall of the dummy gate pattern and a top of the dummy gate pattern. The exposed sacrificial layer is removed to form an L-shaped sacrificial layer pattern exposing a partial sidewall of the protruding channel region below the dummy gate pattern. The sacrificial oxide layer is removed. An epitaxial layer is formed covering the partial sidewall of the protruding channel region exposed by the sacrificial layer pattern and lower sidewall of the sacrificial layer pattern and the dummy gate pattern. A first insulation layer is stacked and planarized to expose the dummy gate pattern. The first insulation layer, the epitaxial layer, the sacrificial layer pattern, and a predetermined portion of the substrate are sequentially etched to form a trench exposing the epitaxial layer and a sidewall of the sacrificial layer pattern. The sacrificial layer pattern exposed by the trench is removed. A second insulation layer is formed to form a depletion barrier layer filling a path where the sacrificial layer pattern is removed and to fill the trench. The dummy gate pattern is removed. A gate pattern is formed at a region where the dummy gate pattern is removed and the first and second insulation layers are etched to expose the epitaxial layer and to form a device isolation layer including the second insulation layer at the trench.

In other embodiments of the present invention, removing the pad oxide pattern is preceded by implanting impurities into the substrate below the pad oxide pattern. The epitaxial layer may be an epitaxial growth of silicon. The sacrificial layer pattern may be silicon germanium (SiGe). Forming the second insulation layer may be preceded by thermally oxidizing the substrate where the sacrificial layer is removed. The first and second insulation layers may be a material having a same etch selectivity.

BRIEF DESCRIPTION OF THE DRAWINGS

The present invention will now be described with reference exemplary embodiments illustrated in the attached drawings in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Figure 1:
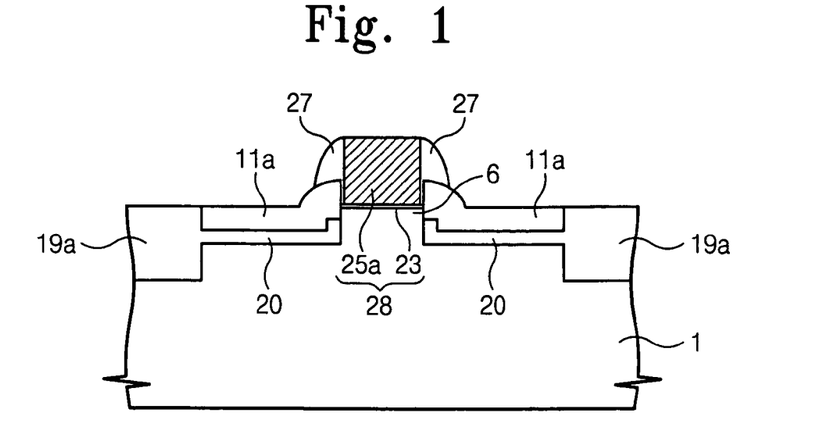
FIG. 1 is a cross-sectional view illustrating a semiconductor (integrated circuit) device according to some embodiments of the present invention.

Various embodiments of the present invention will now be described with reference to the cross-sectional view of FIG. 1. As illustrated in FIG. 1, a semiconductor (integrated circuit) substrate 1 includes a channel region 6 protruding from a surface of the substrate 1. A gate electrode 25a is disposed on a top surface of the channel region 6. The gate electrode 25a may be made, for example, of doped polysilicon. A gate insulation layer 23 is shown in the illustrated embodiments interposed between the gate electrode 25a and the substrate 1. The gate electrode 25a and the gate insulation layer 23 define a gate pattern 28. The gate insulation layer 23 may be made, for example, of thermal oxide.

On the substrate 1, proximate opposite sides of the gate electrode 25a, a source/drain layer 11a, insulated from the gate electrode 25a, is shown as disposed to be in contact with the protruding channel region 6, more particularly, with vertically extending sidewall portions of the protruding channel region 6. The source/drain layer 11a may be made, for example, of doped epitaxial polysilicon. The source/drain layer 11a may protrude upwardly near the sidewall of the gate electrode 25a.

An L-shaped depletion barrier layer 20 is shown in the embodiments of FIG. 1 interposed between the source/drain layer 11a and the substrate 1 to insulate the source/drain layer 11a from the substrate 1, with the exception of a face thereof contacting the vertically extending sidewall portions of the channel region 6. The depletion barrier layer 20 in the illustrated embodiments is spaced apart from the gate insulation layer 23, more particularly, as shown in the embodiments of FIG. 1, vertically displaced therefrom. A distance between the depletion barrier layer 20 and the gate insulation layer 23 may be referred to herein as and "effective source/drain junction depth."

The sidewall of the gate electrode 25a may be covered with a spacer 27. The spacer 27 may be made of silicon nitride and/or silicon oxynitride. The spacer 27 in the embodiments of FIG. 1 is disposed between the gate electrode 25a and the source/drain layer 11a to insulate the gate electrode 25a from the source/drain layer 11a.

A device isolation layer 19a is shown in the embodiments of FIG. 1 formed at a predetermined portion of the substrate 1 through the source/drain layer 11a and the depletion barrier layer 20 and connected to the depletion barrier layer 20. The depletion barrier layer 20 and the device isolation layer 19a may be made of the same material.

Figure 2:
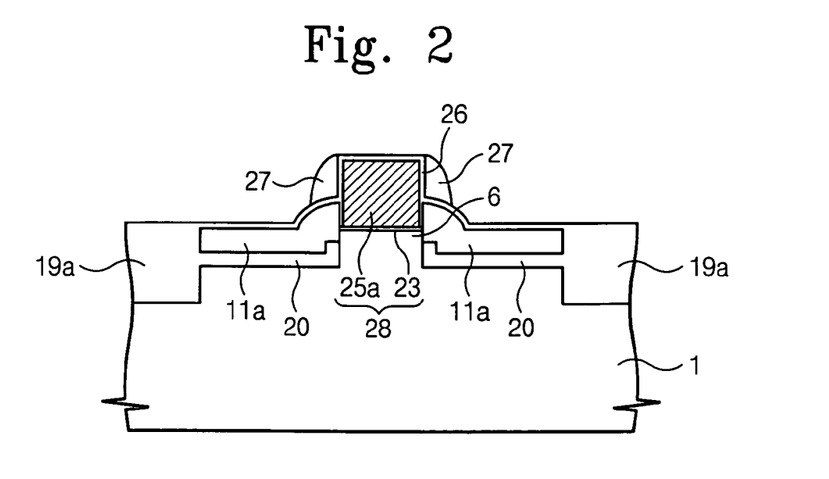
FIG. 2 is a cross-sectional view illustrating a semiconductor (integrated circuit) device according to further embodiments of the present invention.

Referring now to the cross-sectional illustration of FIG. 2, a semiconductor (integrated circuit) device according to further embodiments of the present invention will now be described. Note that various items shown in FIGS. 2 and 3 correspond to the like numbered item in FIG. 1 and will not be further described with reference to FIGS. 2 and 3. In the embodiments of FIG. 2, a surface and sidewall of the gate electrode 25a and a top surface of the source/drain layer 11a are covered with a thermal oxide layer 26. The sidewall of the gate electrode 25a is also covered with a spacer 27 with the thermal oxide layer 26 interposed therebetween.

Figure 3:
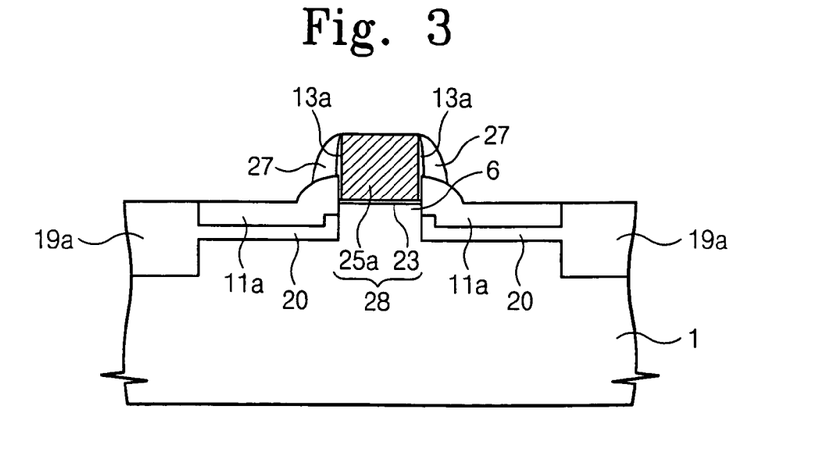
FIG. 3 is a cross-sectional view illustrating a semiconductor (integrated circuit) device according to yet further embodiments of the present invention.

A semiconductor device according to further embodiments of the present invention will now be described with reference to the cross-sectional illustration of FIG. 3. For the embodiments of FIG. 3, an insulation spacer 13a is interposed between the gate electrode 25a and the spacer 27. With the exception of a sidewall of a channel region corresponding to the effective source/drain junction depth, the sidewall and bottom of the source/drain layer 11a are insulated from the semiconductor substrate 1 by the depletion barrier layer 20. In the various embodiments of FIGS. 1-3, the depletion barrier layer 20 may reduce or even prevent various problems, such as leakage current resulting from a short channel effect.

Figure 4:
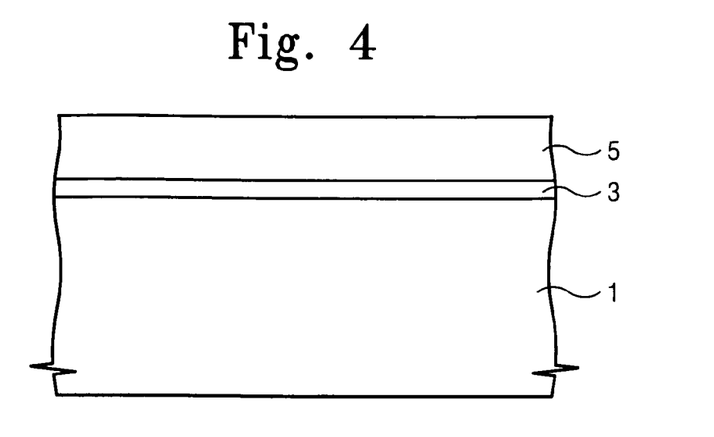
FIG. 4 through FIG. 22 are cross-sectional views illustrating operations for forming a semiconductor (integrated circuit) device according to some embodiments of the present invention.

Operations for forming a semiconductor (integrated circuit) device according to various embodiments of the present invention will now be described with reference to FIG. 4 through FIG. 22. Referring first to FIG. 4, a pad oxide layer 3 and a hard mask layer 5 are sequentially stacked on a semiconductor (integrated circuit) substrate 1. The pad oxide layer 3 may be formed, for example, of a material selected from the group consisting of thermal oxide, high density plasma oxide (HDP oxide), plasma enhanced tetraethyl orthosilicate (PE-TEOS) and undoped silicate glass (USG). The hard mask layer 5 may be, for example, made of silicon nitride and/or silicon oxynitride.

Figure 5:
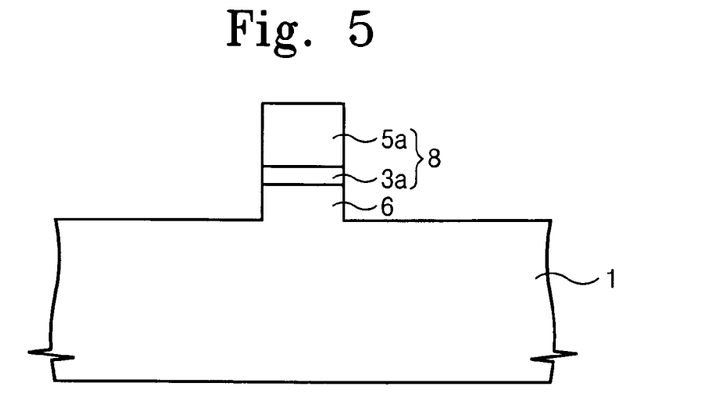

Referring now to FIG. 5, using, for example, a photoresist pattern, the hard mask layer 5 is patterned to form a hard mask pattern 5a. After removal of the photoresist pattern, the pad oxide layer 3 is patterned using the hard mask pattern 5a to form a pad oxide pattern 3a. The pad oxide pattern 3a and the hard mask pattern 5a define a dummy gate pattern 8. Using the dummy gate pattern 8 as an etch mask, the substrate 1 is patterned to form a protruding channel region 6.

Figure 6:
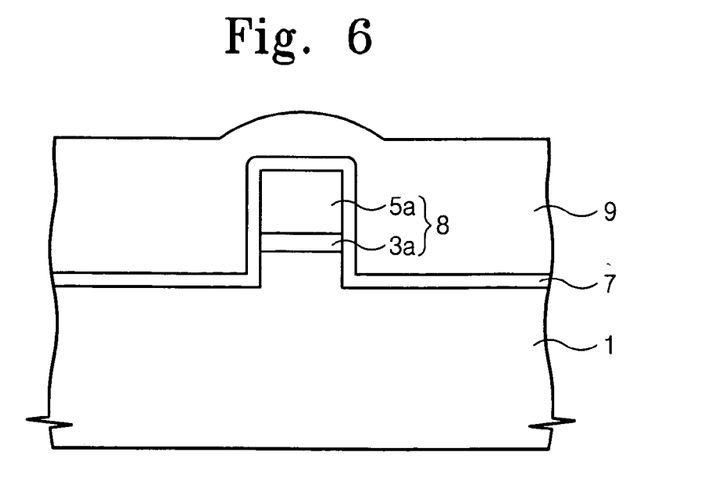

As illustrated in FIG. 6, after a sacrificial layer 7 is conformally stacked on the surface of a substrate 1 where the protruding channel region 6 is formed, a sacrificial oxide layer 9 is formed on the sacrificial layer 7. The sacrificial oxide layer 9 may be made, for example, of at least one material selected from the group consisting of hydrogen silsesquioxane (HSQ), boron phosphorus silicate glass (BPSG), HDP oxide, PETEOS, USG, and phosphorus silicate glass (PSG).

Figure 7:
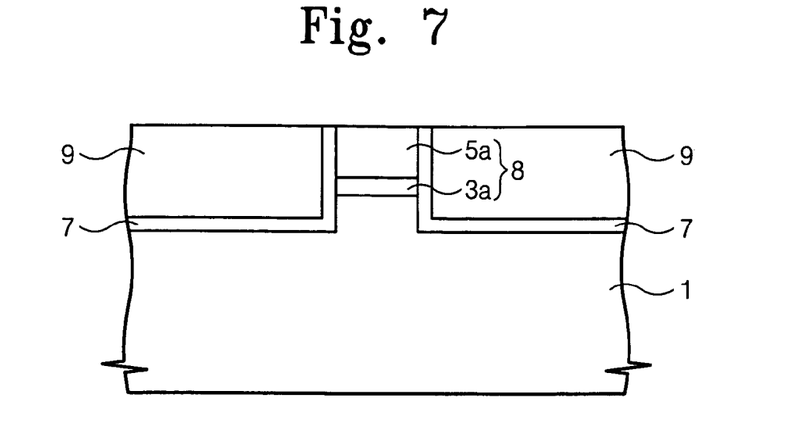

Referring now to FIG. 7, using chemical mechanical polishing (CMP) or the like, the sacrificial oxide layer 9 and the sacrificial layer 7 are planarized to expose the hard mask pattern 5a, thus exposing a top of the dummy gate pattern 8. As shown in FIG. 7, the remaining sacrificial layer 7 and sacrificial oxide layer 9 cover a sidewall of the dummy gate pattern 8, a sidewall of the channel region 6 and the substrate 1.

Figure 8:
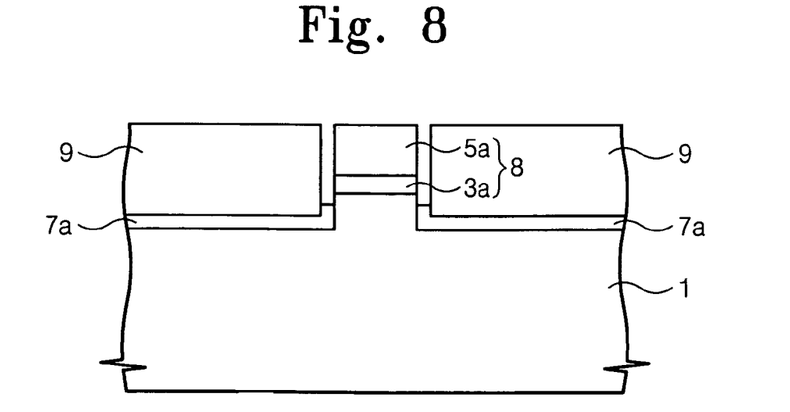

As illustrated in FIG. 8, the exposed sacrificial layer is selectively partially removed to form a sacrificial layer pattern 7a extending along a portion of the sidewall of the channel region 6. The sacrificial layer pattern 7a is shown as L-shaped in the embodiments of FIG. 8. The sacrificial layer pattern 7a in the embodiments of FIG. 8 covers the substrate 1 and a bottom portion of the sidewall of the channel region 6 and is spaced from (not contacting) the pad oxide pattern 3a. The selective removal of the sacrificial layer 7 may be done, for example, by a chemical dry etch using a plasma selected from the group consisting of hydrogen ($H_2$), nitrogen ($N_2$), oxygen ($O_2$), and fluoric compound. In other embodiments of the present invention, the selective removal of the sacrificial layer 7 may be done by a wet etch using an etchant selected from the group consisting of ammonium hydroxide ($NH_4OH$), hydrogen peroxide ($H_2O_2$), deionized water (DI water), and nitric acid.

Figure 9:
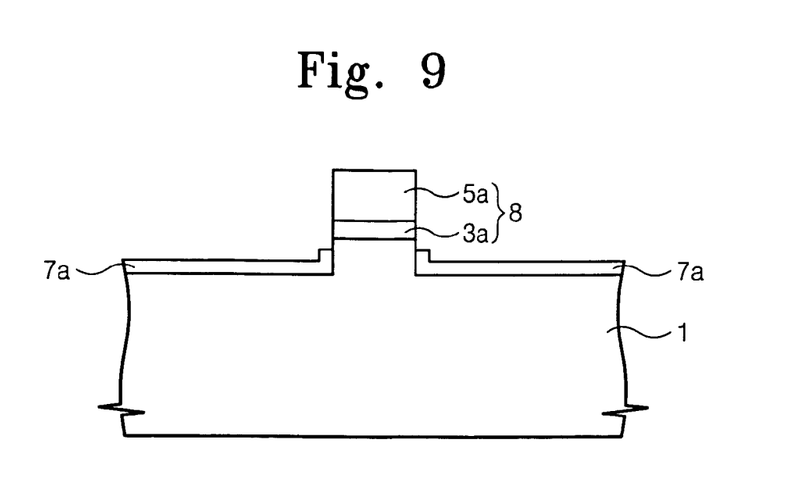

Referring now to FIG. 9, the sacrificial oxide layer 9 is removed to expose the sacrificial pattern 7a. The removal of the sacrificial oxide layer 9 may be done, for example, by an anisotropic etch.

Figure 10:
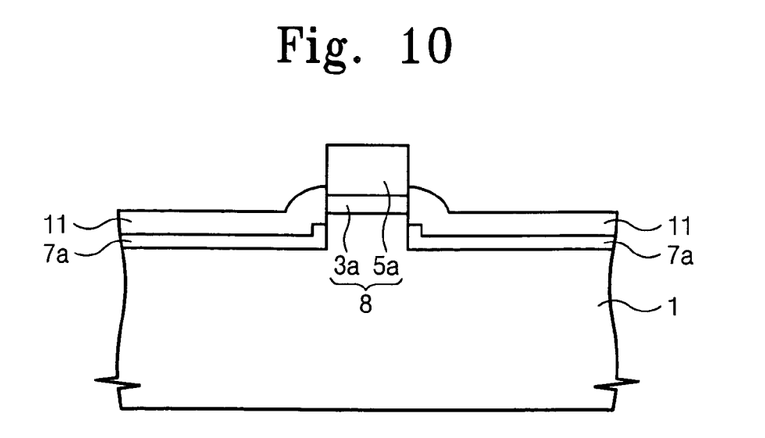

As shown in FIG. 10, single crystalline silicon is grown from an uncovered sidewall of the channel region 6 and a surface of the sacrificial pattern 7a by, for example, epitaxial growth to form an epitaxial layer 11. The epitaxial layer 11 may cover a lower sidewall of the dummy gate pattern 8.

Figure 11:
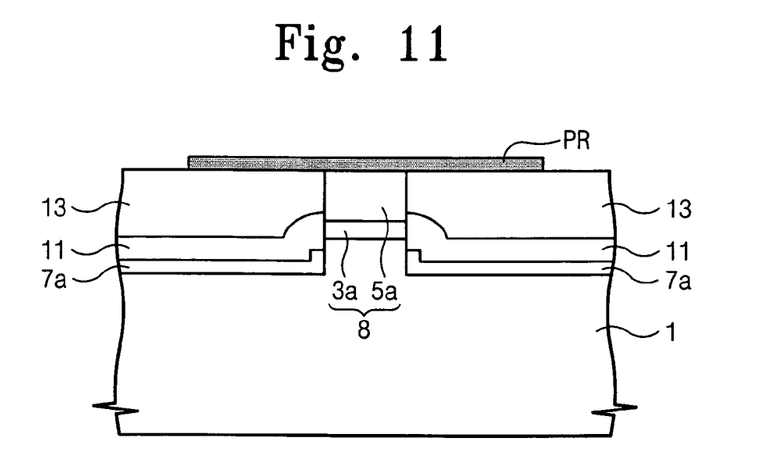

Referring now to FIG. 11, after a first insulation layer 13 is stacked on the semiconductor substrate 1 in a region where the epitaxial layer 11 is formed, a planarization process may be carried out to expose a top surface of the dummy gate pattern 8. The first insulation layer 13 may be formed of a material selected from the group consisting of HSQ, BPSG, HDP oxide, PETEOS, USG, PSG, PE-$SiH_4$, and $Al_2O_3$. A photoresist pattern (PR) is formed on the first insulation layer 13 covering the dummy gate pattern 8.

Figure 12:
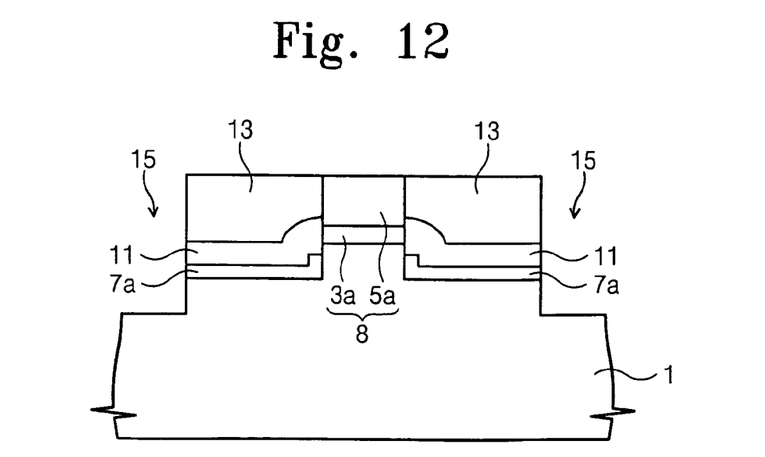
Figure 13:
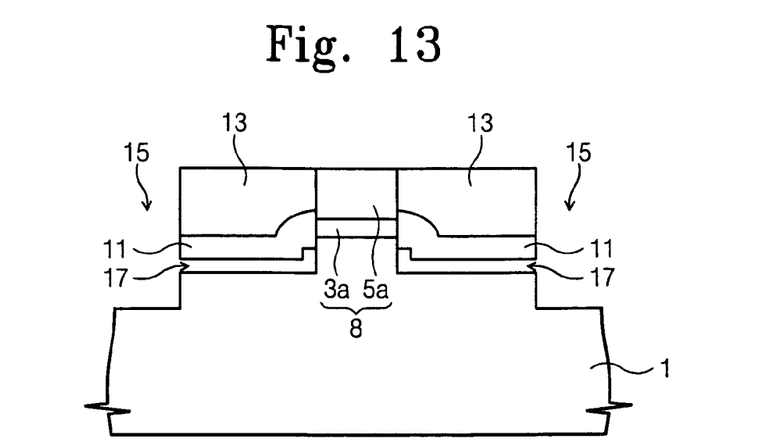

Subsequently, as illustrated in FIG. 12, using the photoresist pattern (PR) as an etch mask, predetermined portions of the first insulation layer 13, the epitaxial layer 11, the sacrificial pattern 7a and the substrate 1 are etched to form the semiconductor device structure illustrated in FIG. 12 having a trench 15 exposing sidewalls of the epitaxial layer 11 and the sacrificial pattern 7a. As illustrated in FIG. 13, the sacrificial layer pattern 7a exposed by the trench 15 is removed. The sacrificial layer pattern 7a may be removed by a chemical dry etch using, for example, a plasma gas selected from the group consisting of hydrogen ($H_2$), nitrogen ($N_2$), oxygen ($O_2$) and fluoric compound. In other embodiments, the sacrificial layer 7a may be removed by a wet etch using, for example, a material selected from the group consisting of ammonium hydroxide ($NH_4OH$), hydrogen peroxide ($H_2O_2$), deionized water (DI water) and nitric acid. Removal of the sacrificial layer pattern 7a results in a vacant space path 17.

Figure 14:
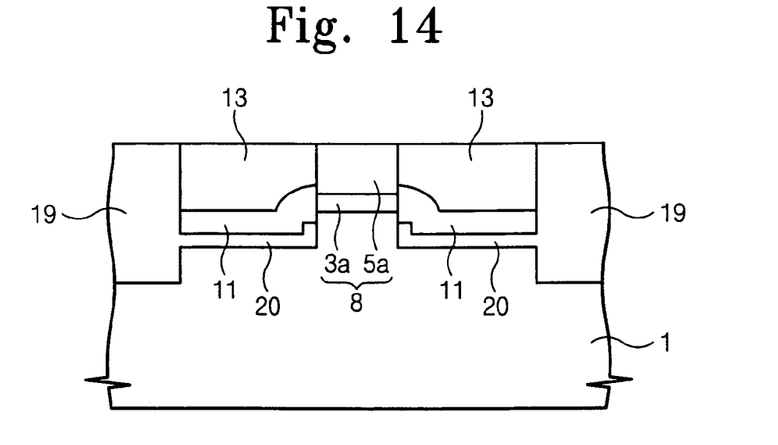

Referring now to FIG. 14, a thermal oxidation process is performed for the substrate 1 in the region where the sacrificial layer pattern 7a is removed. As a result, a thermal oxide layer (not shown) is formed at the path 17, the substrate 1 exposed by the trench 15, and sidewall and bottom of the epitaxial layer 11. The thermal oxidation process 15 may be performed to cure damage occurring during the patterning process for forming the trench 15 and the etching process for removal of the sacrificial layer pattern 7a. A second insulation layer 19 is shown formed on a surface of the substrate 1 to fill the path 17 and trench 15. The second insulation layer 19 is referred to herein as a "depletion barrier layer." The second insulation layer 19 may be made of a material having the same etch selectivity as the first insulation layer, that is, the second insulation layer 19 may be made of a material selected from the group consisting of HSQ, BPSG, HDP oxide, PETEOS, USG, PSG, PE-$SiH_4$, and $Al_2O_3$. The second insulation layer 19 may be planarized to expose a top surface of the dummy gate pattern 8.

Figure 15:
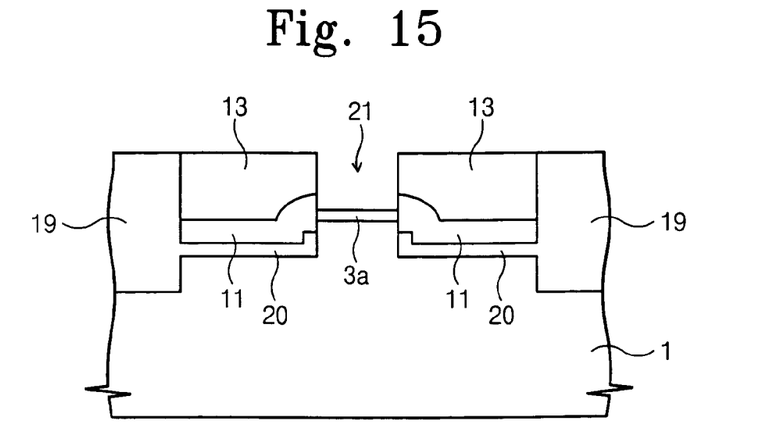
Figure 16:
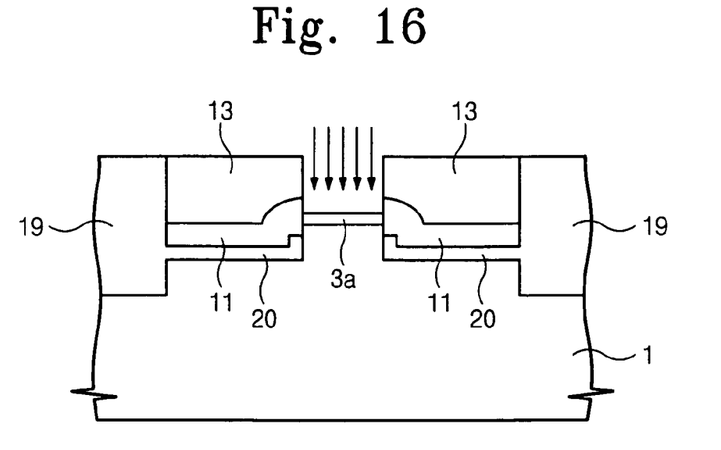

As shown in FIG. 15, the hard mask pattern 5a of the dummy gate pattern 8 is removed. A considerable portion of the hard mask pattern 5a may be removed by a dry etch, while a remaining portion of a predetermined thickness (e.g., 10 nanometers) may remain after etching. The remaining hard mask pattern 5a, in some embodiments, may be completely removed, for example, by a wet etch using phosphoric acid or the like. A first groove 21 is formed to expose a sidewall of the first insulation layer 13, the top surface of the pad oxide pattern 3a, and a partial sidewall of the epitaxial layer 11. As illustrated in FIG. 16, impurities are implanted into the substrate 1 below the pad oxide pattern 3a, in the region exposed by the first groove 21 through the pad oxide pattern 3a, to form an impurity region (not shown) of a channel.

Figure 17:
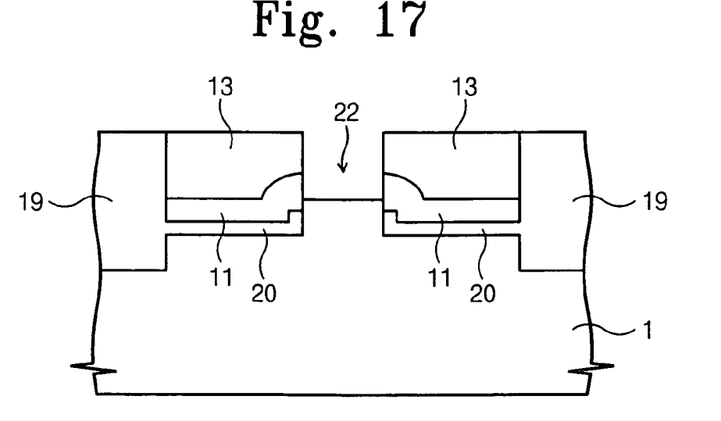

Referring now to the embodiments illustrated in FIG. 17, the pad oxide pattern 3a is removed. The removal of the pad oxide pattern 3a may be done, for example, by wet etching using, for example, hydrofluoric acid (HF) or the like. As a result, a second groove 22 is formed to expose the substrate 1. As a result of the wet etch, a portion of the first 13 and/or second insulation layer 19 may be removed.

Figure 18:
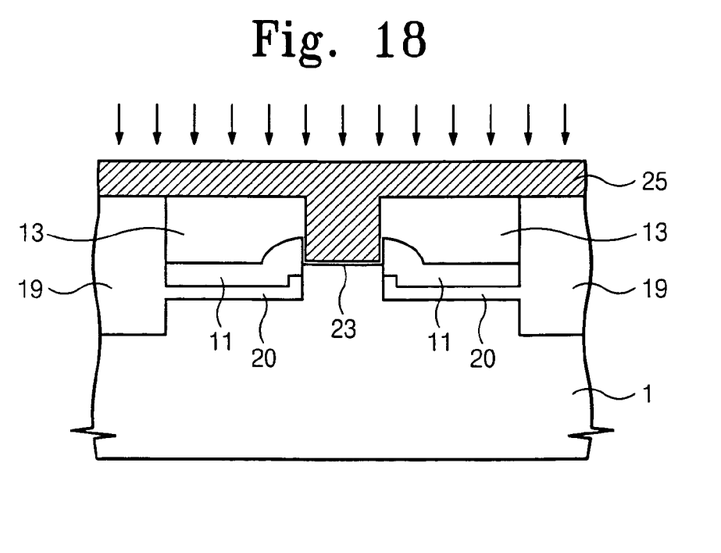

As shown in FIG. 18, a thermal oxidation process is performed on the region of the substrate 1 where the second groove 22 is formed. As a result, a thermal oxide layer 23 is formed on the portion of the substrate 1 exposed by the second groove 22 and on a sidewall of the epitaxial layer 11. The thermal oxide layer 23 may be used as a gate insulation layer. A gate electrode layer 25 is formed is then formed, for example, of polysilicon. After forming the gate electrode layer 25, an ion implanting process may be performed to establish an electrical resistance of the gate electrode layer 25. In other embodiments of the present invention, while the gate electrode layer 25 is being formed, impurities are doped therein to establish the electrical resistance of the gate electrode layer 25.

Figure 19:
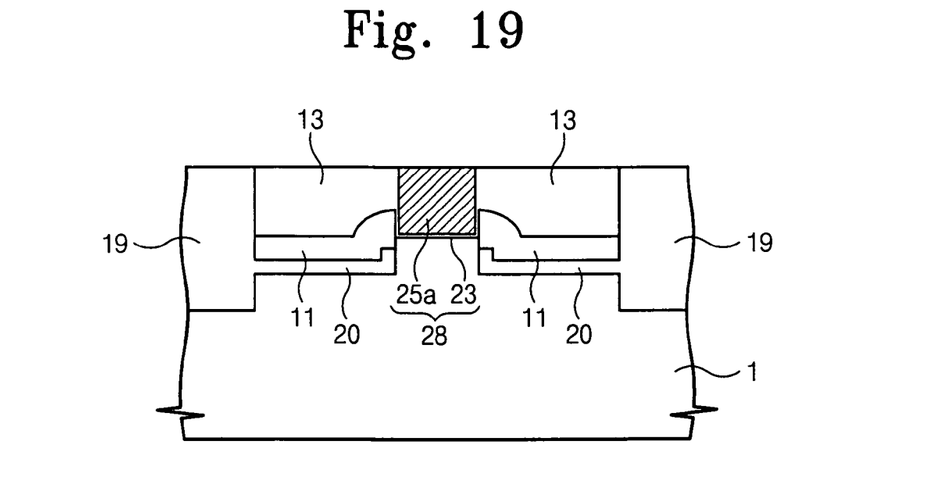
Figure 20:
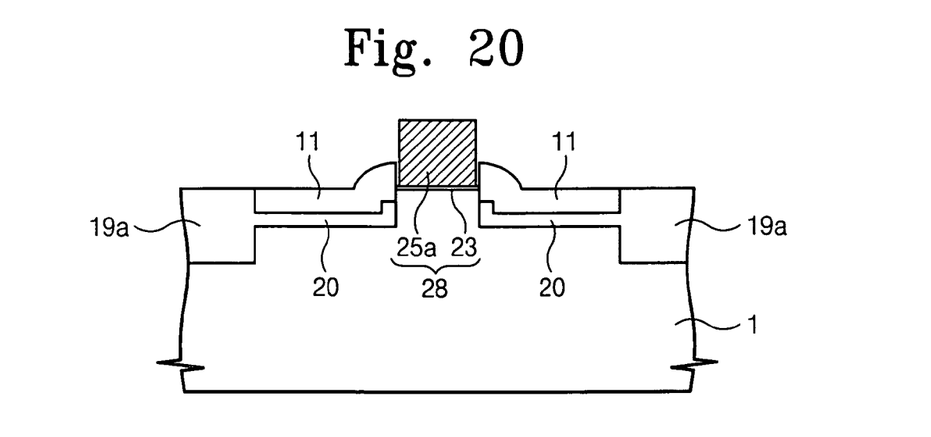

Referring now to FIG. 19, the gate electrode layer 25 may be planarized to expose the first and second insulation layers 13 and 19 while leaving the gate electrode 25a in the second groove 22 where the thermal oxide layer 23 is formed. As seen in FIG. 20, the first and second insulation layers 13 and 19 may be etched to expose the epitaxial layer 11 and to form a device isolation layer 19a in the trench 15. The device isolation layer 19a may have a height corresponding to a height of the epitaxial layer 11. As the first and second insulation layers 13 and 19 may be selected to have the same etch selectivity, they may be etched at the same etch rate. In some embodiments of the present invention, the etch process may be divided into a dry etch for most of the removal of the first and second insulation layers 13 and 19 and a wet etch for removing portions exposing the epitaxial layer 11. Using such an etch process, the thermal oxide layer 23 between the gate electrode 25a and the epitaxial layer 11 may be removed.

Figure 21:
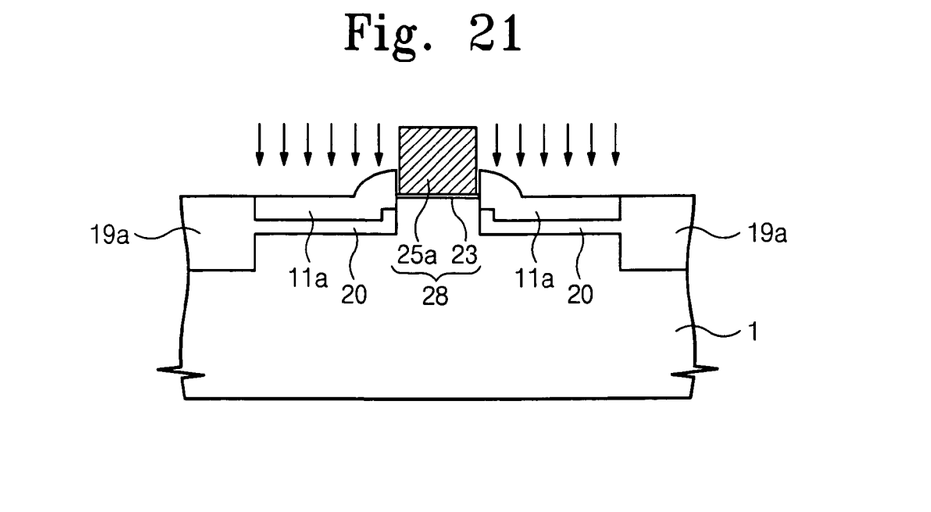
Figure 22:
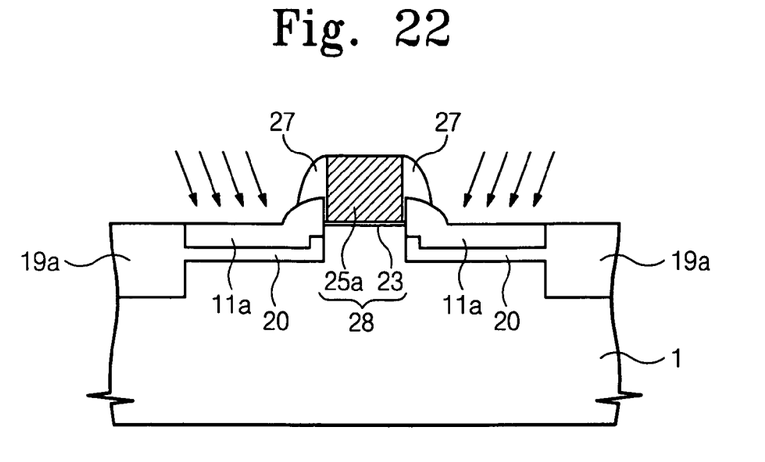

As illustrated in FIG. 21, impurities are implanted into the epitaxial layer 11 to form a source/drain layer 11a. The implantation of the impurities may be done by doping lightly doped impurities. The source/drain layer 11a may be a lightly doped drain (LDD) region. As seen in FIG. 22, after stacking a spacer layer on the substrate 1, an anisotropic etch is performed to form a spacer 27 covering the sidewall of the gate electrode 25a. The spacer 27 may be formed of silicon nitride. The spacer 27 may be disposed between the gate electrode 25a and the source/drain layer 11a to insulate them from each other. A pocket ion implanting process may be performed for the source/drain layer 11a. Using the gate electrode 25a and the spacer 27 as an ion implanting mask, the source/drain layer 11a may be heavily doped with impurities to form a heavily doped impurity region. Operations described with reference to FIGS. 4-22 may provide a semiconductor device as shown in FIG. 1.

Figure 23:
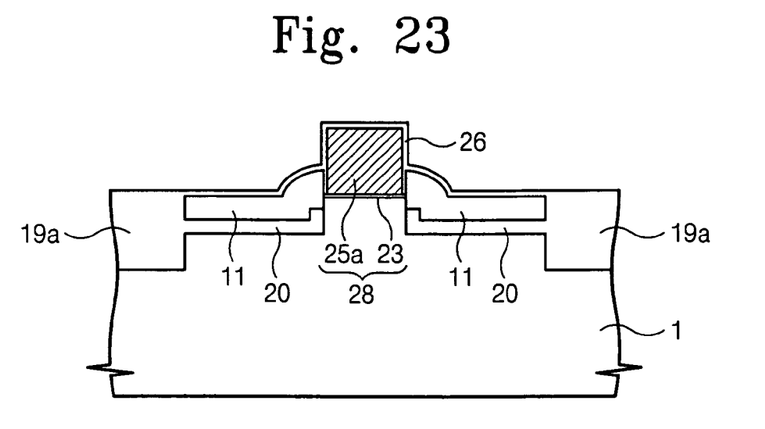
FIG. 23 is a cross-sectional view illustrating operations for forming a semiconductor (integrated circuit) device according to further embodiments of the present invention.

Variations on the methods described with reference to FIGS. 4-22 will now be described for forming a device as described with reference to FIG. 2 above. In particular, as shown in FIG. 23, in the event that the first insulation layer 13 between the gate electrode 25a and the epitaxial layer 11 is removed by an etch process as shown in FIG. 20, a gate re-oxidation process may be performed to form a thermal oxide layer 26 covering the gate electrode 25a and a surface of the epitaxial layer 11. In a subsequent process, an ion implanting process may be performed and a spacer 27 may be formed as discussed with reference to FIG. 21 and FIG. 22 above to provide a semiconductor device as shown in FIG. 2.

Figure 24:
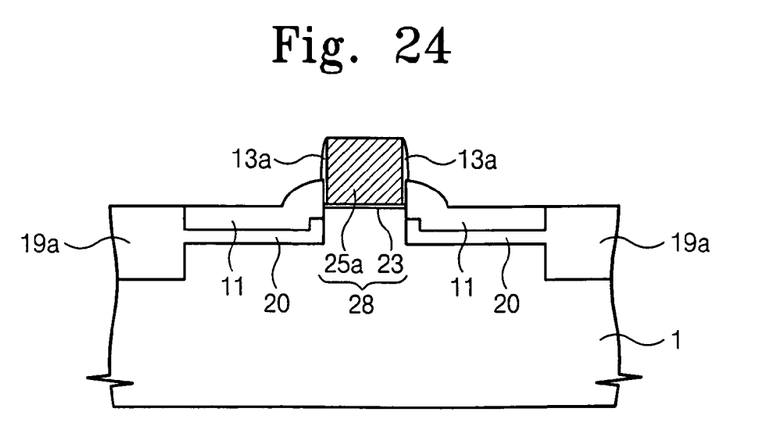
FIG. 24 is a cross-sectional view illustrating operations for forming a semiconductor (integrated circuit) device according to yet further embodiments of the present invention.

Variations on the methods described with reference to FIGS. 4-22 will now be described for forming a device as described with reference to FIG. 3 above. In particular, as shown in FIG. 24, while etching the first and second insulation layers 13 and 19 shown in FIG. 19, the first insulating layer 13 may not be completely removed and remain as an insulating spacer 13a covering the sidewall of the gate electrode 25a. In a subsequent process, an ion implanting process may be performed and a spacer 27 may be formed as discussed with reference to FIG. 21 and FIG. 22 to provide a semiconductor device as shown in FIG. 3.

For each of the various embodiments described above, in a subsequent process, a rapid thermal annealing process may be performed on the semiconductor device to activate the impurities doped by the ion implanting processes. After an interlayer dielectric is stacked, a contact plug may be formed to be electrically connected to the source/drain layer 11a through the interlayer dielectric.

According to various embodiments of the methods described above, using an etch selectivity of silicon and silicon germanium as a sacrificial layer, an L-shaped depletion barrier layer may be formed to insulate source/drain regions from a semiconductor substrate except an in area contacting a channel region. As a result, it may be possible to reduce or prevent problems such as leakage current.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device, comprising:
an integrated circuit substrate having a channel region therein;
a gate pattern disposed on a top surface of the channel region;
an L-shaped depletion barrier layer covering a surface of the integrated circuit substrate adjacent opposite sides of the gate pattern and extending along a portion of a lateral face of the channel region;
a source/drain layer disposed on the depletion barrier layer and electrically contacting the lateral face of the channel region in a region not covered by the depletion barrier layer, the source/drain layer including a dopant therein; and
a thermal oxide layer covering a top surface and a sidewall of the gate pattern and a top surface of the source/drain layer, the thermal oxide layer including the dopant therein.

2. The integrated circuit device of claim 1 wherein the channel region protrudes from a surface of the substrate.

3. The integrated circuit device of claim 2 wherein the device further comprises a device isolation layer disposed at a predetermined portion of the substrate through the source/drain layer and the depletion barrier layer.

4. The integrated circuit device of claim 3, wherein the depletion barrier layer and the device isolation layer are formed of the same material.

5. The integrated circuit device of claim 1, wherein the source/drain layer comprises epitaxial silicon doped with impurities.

6. The integrated circuit device of claim 1, further comprising a sidewall spacer covering a sidewall face of the gate pattern, wherein the thermal oxide layer is interposed between the gate pattern and the sidewall spacer.

7. The integrated circuit device of claim 6, further comprising an insulating spacer interposed between the gate pattern and the sidewall spacer.

8. The integrated circuit device of claim 1, wherein the gate pattern includes a gate insulation layer contacting the channel region and a gate electrode disposed on the gate insulation layer.

9. The integrated circuit device of claim 1, wherein the L-shaped depletion barrier layer has a portion defining the L-shape extending along the portion of a lateral face of the channel region to a height exceeding a height of an upper surface of the depletion barrier layer covering the surface of the integrated surface substrate.

10. The integrated circuit device of claim 9, wherein the depletion barrier layer comprises hydrogen silsesquioxane (HSQ), boron phosphorus silicate glass (BPSG), high density plasma (HDP) oxide, plasma enhanced tetraethyl orthosilicate (PETEOS), undoped silicate glass (USG), phosphorus silicate glass (PSG), plasma enhanced siliconhydride (PE-SiH$_4$), aluminum oxide (Al$_2$O$_3$), silicon nitride (Si$_3$N$_4$) and/or silicon oxynitride (SiON).

11. The integrated circuit device of claim 10, wherein the depletion barrier layer comprises hydrogen silsesquioxane (HSQ), boron phosphorus silicate glass (BPSG), high density plasma (HDP) oxide, plasma enhanced tetraethyl orthosilicate (PETEOS), undoped silicate glass (USG), phosphorus silicate glass (PSG) and/or plasma enhanced siliconhydride (PE-SiH$_4$).

12. The integrated circuit device of claim 9, wherein a distance between the portion defining the L-shape of the depletion barrier layer and a gate insulation layer of the gate pattern is selected to provide a desired effective source/drain junction depth.

* * * * *